US009350061B2

(12) United States Patent
Seo et al.

(10) Patent No.: US 9,350,061 B2
(45) Date of Patent: May 24, 2016

(54) RESONANCE DEVICE AND FILTER INCLUDING THE SAME

(71) Applicant: Innertron, Inc., Incheon (KR)

(72) Inventors: Soo Duk Seo, Incheon (KR); Hak Rae Cho, Incheon (KR); Moon Bong Ko, Incheon (KR)

(73) Assignee: INNERTRON, INC. (KR)

( * ) Notice: Subject to any disclaimer, the term of this patent is extended or adjusted under 35 U.S.C. 154(b) by 82 days.

(21) Appl. No.: 14/288,649

(22) Filed: May 28, 2014

(65) Prior Publication Data

US 2015/0325899 A1 Nov. 12, 2015

(30) Foreign Application Priority Data

May 8, 2014 (KR) ........................ 10-2014-0054949

(51) Int. Cl.
*H03H 9/25* (2006.01)
*H01P 1/20* (2006.01)

(52) U.S. Cl.
CPC ........................................ *H01P 1/20* (2013.01)

(58) Field of Classification Search
CPC ......... H01P 7/10; H01P 1/205; H01P 1/2136; H01P 1/208; H01P 1/2053; H01P 1/2084; H01P 1/202; H01P 1/20; H01P 1/20309; H01P 1/20345; H01P 1/2086; H01P 5/04; H01P 7/06; H01P 7/08; H03H 9/6409
See application file for complete search history.

(56) References Cited

U.S. PATENT DOCUMENTS

| | | | | |
|---|---|---|---|---|
| 5,446,729 | A * | 8/1995 | Jachowski | 370/339 |
| 2003/0001694 | A1* | 1/2003 | Ma et al. | 333/188 |
| 2010/0181869 | A1* | 7/2010 | Pereira da Cunha et al. | 310/313 R |
| 2010/0188174 | A1* | 7/2010 | Zhang et al. | 333/203 |

FOREIGN PATENT DOCUMENTS

| | | |
|---|---|---|
| KR | 1020100048862 | 5/2010 |

* cited by examiner

*Primary Examiner* — Stanetta Isaac
(74) *Attorney, Agent, or Firm* — Cantor Colburn LLP

(57) ABSTRACT

A resonance device including a plurality of resonators arranged in a state of being spaced apart from each other; and a notch resonator formed above the plurality of resonators, wherein the notch resonator includes: a transverse layer having an area overlapping with at least three resonators of the plurality of resonators; and a plurality of short-ended layers connecting the transverse layer to a first ground surface.

10 Claims, 15 Drawing Sheets

RESONANCE DEVICE AND FILTER INCLUDING THE SAME

CROSS REFERENCE TO RELATED APPLICATION(S)

This application claims the benefit of Korean Patent Application No. 10-2014-0054949, filed on May 8, 2014, entitled RESONANCE DEVICE AND FILTER INCLUDING THE SAME, which is hereby incorporated by reference in its entirety into this application.

BACKGROUND OF THE INVENTION

1. Field of the Invention

The exemplary embodiments according to the concept of the present invention relate, in general, to a resonance device and, more particularly, to a resonance device including a notch resonator that has a transverse layer having an area overlapping with at least three resonators, and short-ended layers connecting the transverse layer to a first ground surface, and to a filter including the resonance device.

2. Description of the Related Art

Generally, communication systems use a variety of filters. In communication systems, the filters are devices which screen for and allow to pass only specified frequency band signals, and are classified into low pass filters (LPF), band pass filters (BPF), high pass filters (HPF), band stop filters (BSF), etc. according to frequency bands filtered thereby.

Further, according to methods of manufacturing filters or devices used in filters, the filters may be classified into LC filters, transmission line filters, cavity filters, dielectric resonator (DR) filters, ceramic filters, coaxial filters, waveguide filters, SAW (Surface Acoustic Wave) filters, etc.

To simultaneously realize narrow-band characteristics and excellent intercepting characteristics of a filter, it is required to use a resonator having a high Q-factor. In this case, the resonator typically takes the form of a PCB (Printed Circuit Board) type, a dielectric type or a monoblock type resonator.

DOCUMENTS OF RELATED ART

Patent Document 1 Korean Patent Application Publication No. 10-2010-0048862.

SUMMARY OF THE INVENTION

Accordingly, the present invention has been made keeping in mind the above problems occurring in the related art, and the present invention is intended to propose a resonance device and a filter including the resonance device, in which the resonance device includes a notch resonator that has a transverse layer having an area overlapping with at least three resonators, and short-ended layers connecting the transverse layer to a first ground surface, so the resonance device can realize excellent narrow-band characteristics and excellent intercepting characteristics of the filter.

In an embodiment of the present invention, there is provided a resonance device including: a plurality of resonators arranged in a state of being spaced apart from each other; and a notch resonator formed above the plurality of resonators, wherein the notch resonator includes: a transverse layer having an area overlapping with at least three resonators of the plurality of resonators; and a plurality of short-ended layers connecting the transverse layer to a first ground surface.

In an embodiment, the transverse layer and each of the plurality of short-ended layers may be connected to each other by a via.

In an embodiment, the resonance device may further include: a case provided with the first ground surface and a second ground surface facing the first ground surface, the case enveloping the plurality of resonators and the notch resonator therein.

In an embodiment, each of the plurality of resonators may include: a laminated part having a laminated structure formed by layering a plurality of conductive layers; and a first transmitting layer connected to one of the plurality of conductive layers, wherein the transverse layer may have an area overlapping with first transmitting layer of each of the at least three resonators.

In an embodiment, the plurality of conductive layers may include: a first conductive layer grounded to the second ground surface; a second conductive layer grounded to the second ground surface and placed in a state of being spaced apart from the first conductive layer; and a third conductive layer placed between the first conductive layer and the second conductive layer in a state of being spaced apart from the first conductive layer and the second conductive layer, without being grounded to the second ground surface, wherein the first transmitting layer may be connected to the third conductive layer.

In an embodiment, the plurality of conductive layers may include: a first conductive layer connected to the second ground surface; and a second conductive layer placed in a state of being spaced apart from the first conductive layer, without being grounded to the second ground surface, wherein the first transmitting layer may be connected to the second conductive layer.

In an embodiment, the resonance device may further include: a second transmitting layer connected to another one of the plurality of conductive layers, wherein the plurality of conductive layers may include: a first conductive layer connected to the second ground surface; a second conductive layer grounded to the second ground surface and placed in a state of being spaced apart from the first conductive layer; a third conductive layer placed between the first conductive layer and the second conductive layer in a state of being spaced apart from the first conductive layer and the second conductive layer, without being grounded to the second ground surface; and a fourth conductive layer placed between the second conductive layer and the third conductive layer in a state of being spaced apart from the second conductive layer and the third conductive layer, without being grounded to the second ground surface, wherein the laminated part may further include a via electrically connecting the third conductive layer and the fourth conductive layer to each other.

In an embodiment, the first transmitting layer may be connected to the third conductive layer, and the second transmitting layer may be connected to the fourth conductive layer.

In an embodiment, the plurality of conductive layers may include: a first conductive layer connected to the second ground surface; a second conductive layer grounded to the second ground surface and placed in a state of being spaced apart from the first conductive layer; a third conductive layer placed between the first conductive layer and the second conductive layer in a state of being spaced apart from the first conductive layer and the second conductive layer, without being grounded to the second ground surface; a fourth conductive layer placed in a state of being spaced apart from the first conductive layer and opposite to the third conductive layer based on the first conductive layer, without being grounded to the second ground surface; and a fifth conductive layer placed in a state of being spaced apart from the second conductive layer and opposite to the third conductive layer based on the second conductive layer, without being grounded to the second ground surface, wherein the laminated part may further include a via electrically connecting the third conductive layer, the fourth conductive layer and the fifth conductive layer to each other.

In an embodiment of the present invention, there is provided a band pass filter including the resonance device.

The resonance device of an embodiment of the present invention is advantageous in that it includes a notch resonator having a transverse layer having an area overlapping with at least three resonators, and short-ended layers connecting the transverse layer to a first ground surface, so the resonance device can realize excellent narrow-band characteristics and excellent intercepting characteristics of the filter.

BRIEF DESCRIPTION OF THE DRAWINGS

The above and other objects, features and advantages of the present invention will be more clearly understood from the following detailed description when taken in conjunction with the accompanying drawings, in which.

DESCRIPTION OF SYMBOLS

Figure 1:
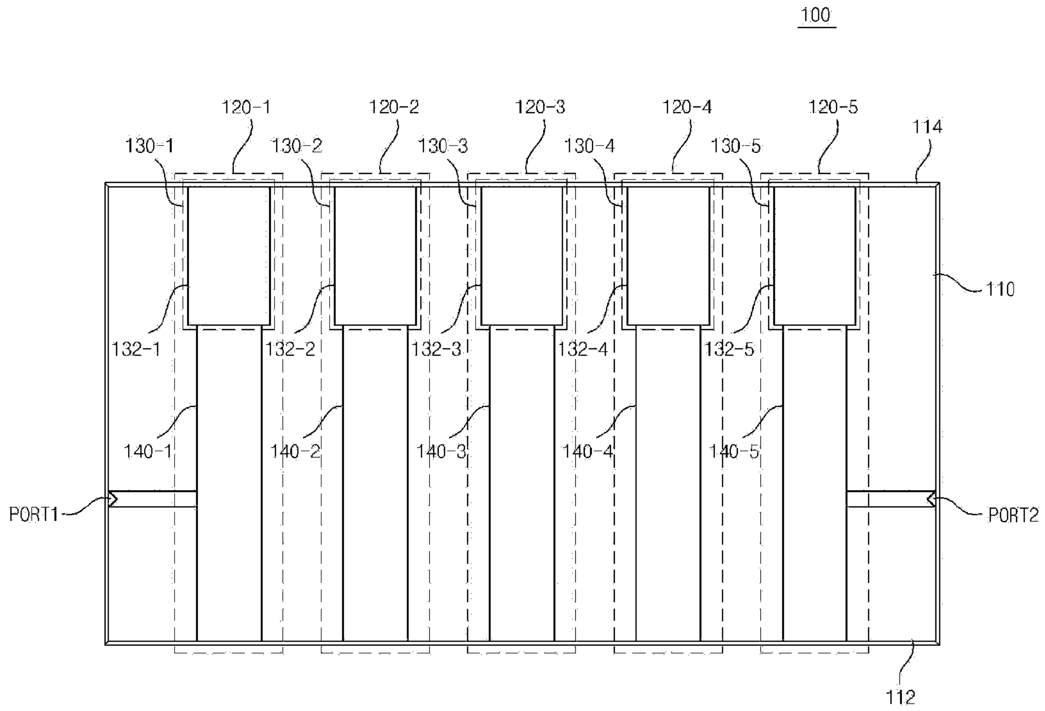
FIG. 1 is a plan view of a resonance device to which the operational performance of a resonance device according to an embodiment of the present invention is compared.

100, 200, 200A, 200B: resonance device
120-1~120-5, 220-1~220-5: resonator
241, 241A, 241B: Notch resonator
130-1~130-5, 230-1~230-5: laminated part
140-1~140-5, 240-1~240-5: transmitting layer

DETAILED DESCRIPTION OF THE INVENTION

In the following description, the structural or functional description specified to exemplary embodiments according to the concept of the present invention is intended to describe the exemplary embodiments, so it should be understood that the present invention may be variously embodied, without being limited to the exemplary embodiments.

The exemplary embodiments according to the concept of the present invention may be variously modified and may have various shapes, so examples of which are illustrated in the accompanying drawings and will be described in detail with reference to the accompanying drawings. However, it should be understood that the exemplary embodiments according to the concept of the present invention are not limited to the embodiments which will be described hereinbelow with reference to the accompanying drawings, but various modifications, equivalents, additions and substitutions are possible, without departing from the scope and spirit of the invention.

It will be understood that, although the terms first, second, etc. may be used herein to describe various elements, these elements should not be limited by these terms. These terms are only used to distinguish one element, from another element. For instance, a first element discussed below could be termed a second element without departing from the teachings of the present invention. Similarly, the second element could also be termed the first element.

It will be understood that when an element is referred to as being "coupled" or "connected" to another element, it can be directly coupled or connected to the other element or intervening elements may be present therebetween.

In contrast, it should be understood that when an element is referred to as being "directly coupled" or "directly connected" to another element, there are no intervening elements present. Further, the terms used herein to describe a relationship between elements, for example, "between", "directly between", "adjacent" or "directly adjacent" should be interpreted in the same manner as those described above.

The terminology used herein is for the purpose of describing particular embodiments only and is not intended to be limiting. As used herein, the singular forms "a," "an" and "the" are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which this invention belongs.

It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
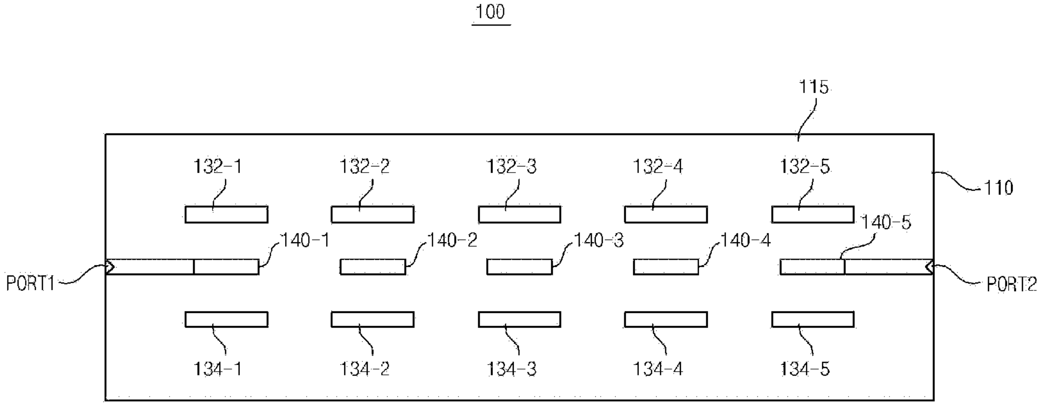
FIG. 2 is a front view of an embodiment of the resonance device shown in FIG. 1.

FIG. 1 is a plan view of a resonance device to which the operational performance of a resonance device according to an embodiment of the present invention is compared. FIG. 2 is a front view of an embodiment of the resonance device shown in FIG. 1.

As shown in FIGS. 1 and 2, the resonance device 100 may include a case 110, a plurality of resonators 120-1 to 120-5 provided in the case 110, and a plurality of ports PORT1 and PORT2.

Although the case 110 shown in FIG. 1 has a rectangular shape, it should be understood that the shape of the case 110 is not limited to the rectangular shape.

The case 110 may include a first ground surface 112 and a second ground surface 114 which face each other. In an embodiment, all the surfaces of the case 110, which include the first ground surface 112 and the second ground surface 114, may be made of a conductive material. In another embodiment, all or a part of the surfaces of the case 110, with the exception of the first ground surface 112 and the second ground surface 114, may be made of a conductive material.

The case 110 made of a conductive material may protect the plurality of resonators 120-1 to 120-5 provided therein from external environment. In other words, the case 110 may intercept electromagnetic waves produced by other devices placed around the case 110 or by the flow of an electric current in a circuit, thereby preventing the external environment from affecting the operation of the resonators 120-1 to 120-5 provided in the case 110.

In an embodiment, the interior of the resonance device 100 which is a space 115 of the case 110 may be charged with a dielectric material, for example, ceramic.

The plurality of resonators 120-1 to 120-5 may include respective laminated parts 130-1 to 130-5 and respective transmitting layers 140-1 to 140-5.

Here, the laminated parts 130-1 to 130-5 may include respective conductive layers 132-1 to 132-5 and respective conductive layers 134-1 to 134-5, in which the conductive layers 132-1 to 132-5 and associated conductive layers 134-1 to 134-5 are spaced apart from each other and form respective laminated structures.

The layer structure (for example, the number and arrangement of layers) of each of the resonators 120-1 to 120-5 including the respective laminated parts 130-1 to 130-5 and the respective transmitting layers 140-1 to 140-5 may be practically equal to the layer structure of resonators 220-1 to 220-5 of FIG. 4 which will be described later herein, so the layer structure of the resonators 120-1 to 120-5 will be described in detail later herein with reference to FIGS. 11 to 18.

The first port PORT1 may be connected to the transmitting layer 140-1 of the first resonator 120-1, and the second port PORT2 may be connected to the transmitting layer 140-5 of the fifth resonator 120-5.

Each of the first port PORT1 and the second port PORT2 may be a signal input port or a signal output port through which a signal is input to or output from the resonance device 100.

Figure 3:
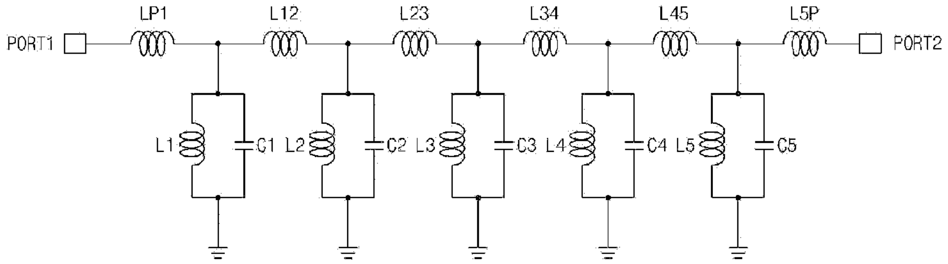
FIG. 3 is an equivalent circuit diagram of an embodiment of the resonance device shown in FIG. 1.

FIG. 3 is an equivalent circuit diagram of an embodiment of the resonance device shown in FIG. 1.

As shown in FIGS. 1 to 3, the laminated parts 130-1 to 130-5 and the transmitting layers 140-1 to 140-5 of the resonance device 100 of FIG. 1 may have capacitance components and inductance components, and may be equivalent to an LC resonant circuit of FIG. 3 based on the capacitance components and the inductance components. Furthermore, the resonance device 100 of FIG. 1 may function as a band pass filter (BPF).

The inductance component of the first resonator 120-1 may be equivalent to a first inductor L1, and the capacitance component of the first resonator 120-1 may be equivalent to a first capacitor C1.

Further, the inductance component between the first port PORT1 and the first resonator 120-1 may be equivalent to a sixth inductor LP1, and the inductance component between the first resonator 120-1 and the second resonator 120-2 may be equivalent to a seventh inductor L12.

In the same manner, the resonance device 100 of FIG. 1 may be equivalent to the LC resonant circuit of FIG. 3 which includes a plurality of inductors L1 to L5, LP1, L12, L23, L34, L45 and L5P and a plurality of capacitors C1 to C5.

Further, the magnitudes of the capacitance components of the resonators 120-1 to 120-5 may be controlled by controlling at least one of the number, shape and area of the conductive layers forming the respective laminated parts 130-1 to 130-5, and the spaced distance between a plurality of laminated conductive layers.

Further, the magnitudes of the inductance components of the resonators 120-1 to 120-5 may be controlled by controlling at least one the length and area of the respective transmitting layers 140-1 to 140-5.

In other words, the magnitudes of the capacitance components and the magnitudes of the inductance components of the resonance device 100 may be controlled by controlling the above-mentioned factors. When the resonance device 100 functions as a band pass filter, the passband of the band pass filter may be controlled by controlling the magnitudes of the capacitance components and the magnitudes of the inductance components.

Figure 4:
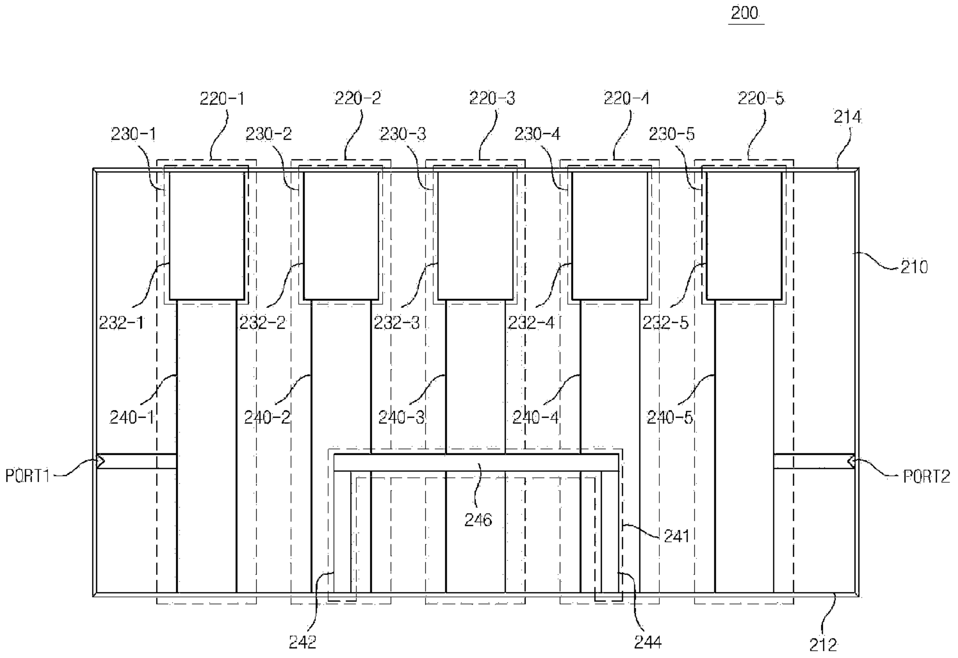
FIG. 4 is a plan view of a resonance device according to an embodiment of the present invention.

FIG. 4 is a plan view of a resonance device according to an embodiment of the present invention.

As shown in FIGS. 1 and 4, when compared to the resonance device 100 of FIG. 1, the resonance device 200 according to an embodiment of the present invention may further include a notch resonator 241.

Here, the structure of the plurality of resonators 220-1 to 220-5 of the resonance device 200 shown in FIG. 4 may practically remain the same as the structure of the plurality of resonators 120-1 to 120-5 of the resonance device 100 shown in FIG. 1.

In an embodiment, all the surfaces of a case 210, which include a first ground surface 212 and a second ground surface 214, may be made of a conductive material. In another embodiment, all or a part of the surfaces of the case 210 with the exception of the first ground surface 212 and the second ground surface 214 may be made of a conductive material.

Further, the notch resonator 241 may include a transverse layer 246 and a plurality of short-ended layers 242 and 244.

The structure of the notch resonator 241 will be described in detail later herein with reference to FIGS. 5 to 8.

Figure 5:
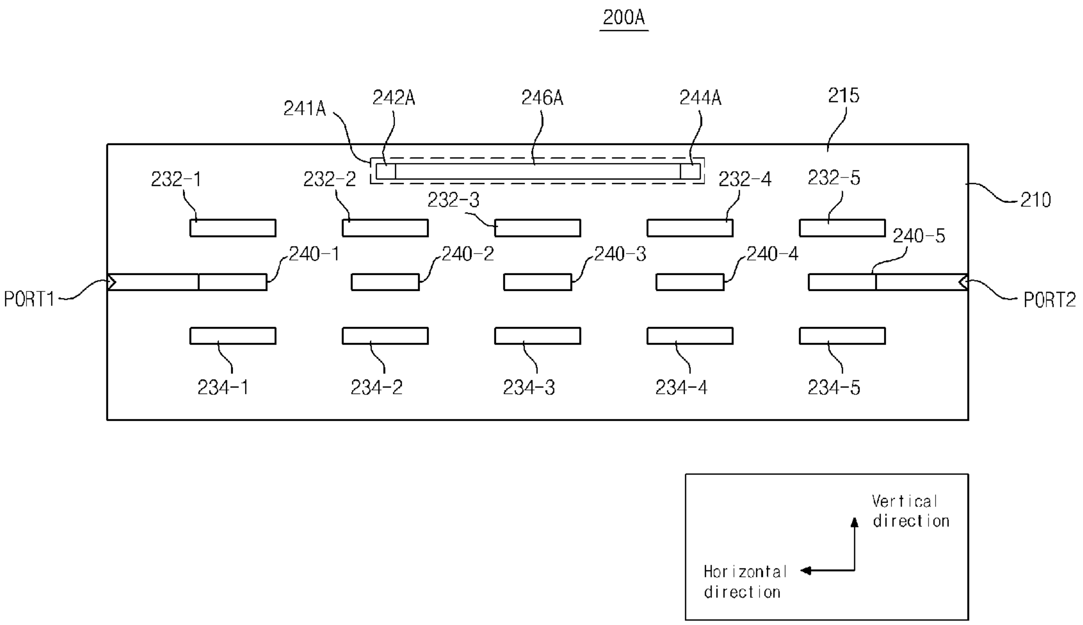
FIG. 5 is a front view of an embodiment of the resonance device shown in FIG. 4.
Figure 6:
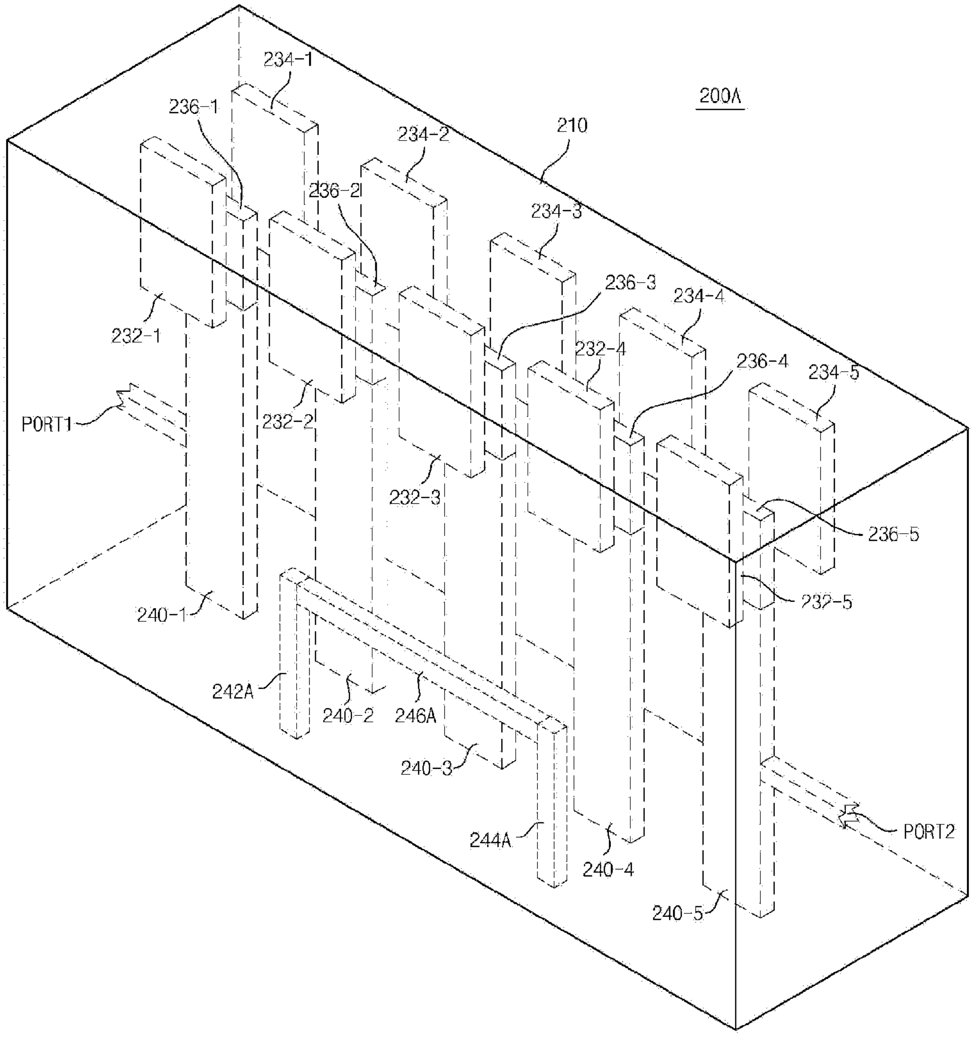
FIG. 6 is a perspective view of the resonance device shown in FIG. 5.

FIG. 5 is a front view of an embodiment of the resonance device shown in FIG. 4. FIG. 6 is a perspective view of the resonance device shown in FIG. 5.

Referring to FIGS. 4 to 6, the conductive layers 232-1 to 232-5, 234-1 to 234-5 and the transmitting layers 240-1 to 240-5 of a resonance device 200A of FIG. 5 which is an embodiment of the resonance device 200 of FIG. 4 are practically equal to the conductive layers 132-1 to 132-5, 134-1 to 134-5 (see FIG. 2) and the transmitting layers 140-1 to 140-5 (see FIG. 2) of the resonance device 100, and further explanation thereof will be omitted in the following description.

In an embodiment, the interior of the resonance device 200A which is the space 215 of the case 210 may be charged with a dielectric material, for example, ceramic.

In another embodiment, the space 215 of the case 210 may be charged with a dielectric material having a permittivity of 15 to 45, and the resonance device 200A may function as a band pass filter (for example, a narrow band pass filter) having central frequencies of 800 MHz~2.6 GHz.

The notch resonator 241A of FIG. 5 which is an embodiment of the notch resonator 241 of FIG. 4 may include a transverse layer 246A and a plurality of short-ended layers 242A and 244A. Here, the transverse layer 246A and the plurality of short-ended layers 242A and 244A may be formed on the same plane.

The notch resonator 241A may be formed above the plurality of resonators 220-1 to 220-5.

The transverse layer 246A may be placed in a state of being spaced apart from the plurality of resonators 220-1 to 220-5, for example, in vertical directions.

The transverse layer 246A may have an area overlapping with at least three resonators (for example, resonators 220-2 to 220-4) of the plurality of resonators 220-1 to 220-5, for example, in vertical directions. Here, the at least three resonators having areas overlapping with the transverse layer 246A may be continuously arranged in a state of being adjacent to each other.

The plurality of short-ended layers 242A and 244A may be placed in a state of being spaced apart from the plurality of resonators 220-1 to 220-5, for example, in vertical directions.

The plurality of short-ended layers 242A and 244A may connect the transverse layer 246A to the first ground surface 212. In an embodiment, the plurality of short-ended layers 242A and 244A may be directly connected to the transverse layer 246A.

The transverse layer 246A and the plurality of short-ended layers 242A and 244A may be made of a conductive material.

The conductive layers 236-1 to 236-5 may be associated with the laminated parts 230-1 to 230-5 of FIG. 4, respectively, and may be placed between the conductive layers 232-1 to 232-5 and associated conductive layers 234-1 to 234-5. Here, the conductive layers 236-1 to 236-5 may be placed, without being grounded to the second ground surface 214 (see FIG. 4).

Figure 7:
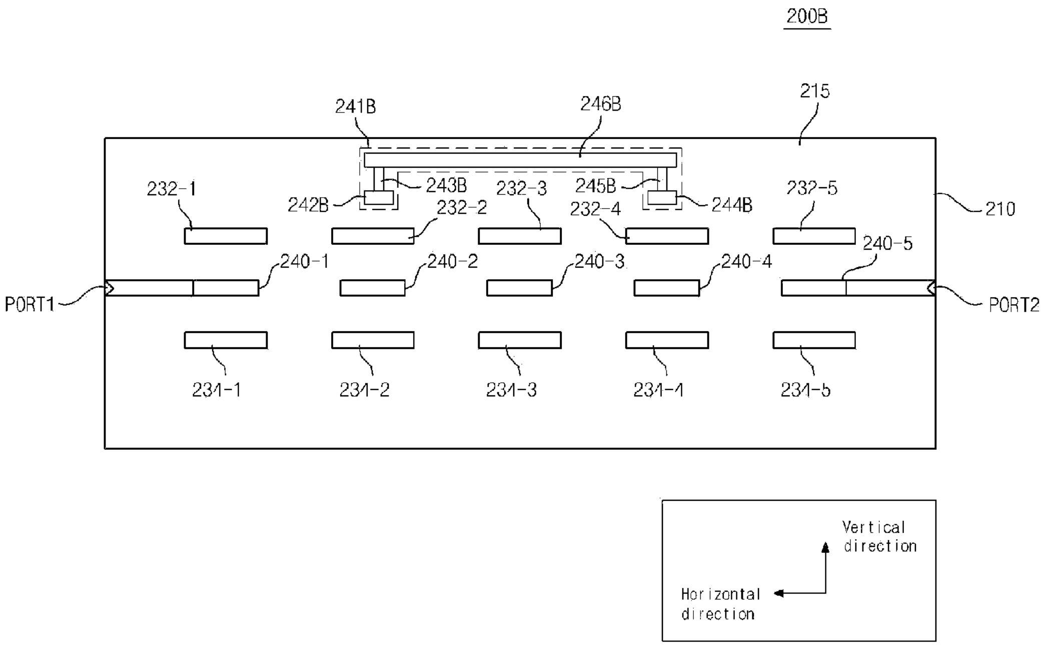
FIG. 7 is a front view of another embodiment of the resonance device shown in FIG. 4.
Figure 8:
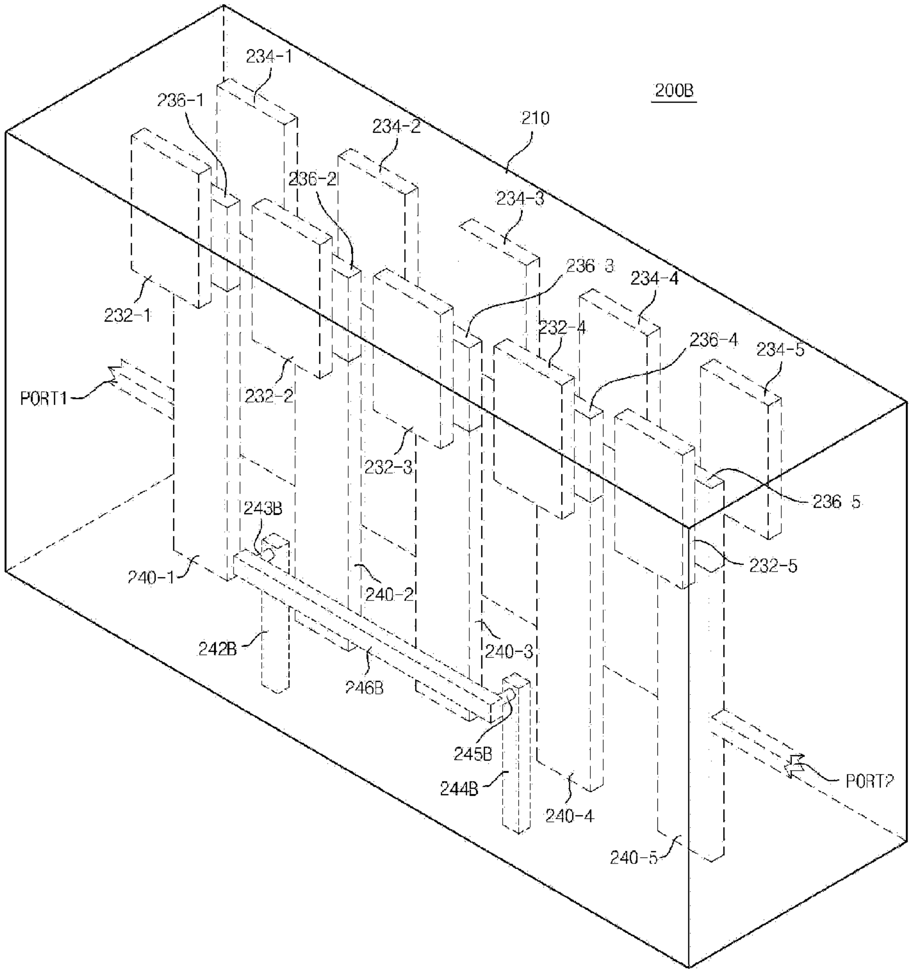
FIG. 8 is a perspective view of the resonance device shown in FIG. 7.

FIG. 7 is a front view of another embodiment of the resonance device shown in FIG. 4. FIG. 8 is a perspective view of the resonance device shown in FIG. 7.

As shown in FIGS. 4 to 8, the resonance device 200B of FIG. 7 has the same structure as that of the resonance device 200A of FIG. 5, with the exception of a notch resonator 241B.

The notch resonator 241B of FIG. 7 which is another embodiment of the notch resonator 241 of FIG. 4 may include a plurality of short-ended layers 242B and 244B, a plurality of vias 243B and 245B, and a transverse layer 246B. The notch resonator 241B may be formed above the plurality of resonators 220-1 to 220-5.

The transverse layer 246B may be spaced apart from the plurality of resonators 220-1 to 220-5, for example, in vertical directions.

The transverse layer 246B may have an area overlapping with at least three resonators (for example, resonators 220-2 to 220-4) of the plurality of resonators 220-1 to 220-5, for example, in vertical directions. Here, the at least three resonators having areas overlapping with the transverse layer 246B may be continuously arranged in a state of being adjacent to each other.

The plurality of short-ended layers 242B and 244B may be spaced apart from the plurality of resonators 220-1 to 220-5, for example, in vertical directions.

Here, each of the short-ended layers 242B and 244B may connect the transverse layer 246B to the first ground surface 212 by an associated via 243B or 245B. In other words, the first short-ended layer 242B may connect the transverse layer 246B to the first ground surface 212 by a first via 243B, and the second short-ended layer 244B may connects the transverse layer 246B to the first ground surface 212 by a second via 245B.

Each of the vias 243B and 245B may connect an associated short-ended layer 242B, 244B and the transverse layer 246B to each other in a vertical direction.

The plurality of short-ended layers 242B and 244B, the plurality of vias 243B and 245B, and the transverse layer 246B may be made of a conductive material.

Figure 9:
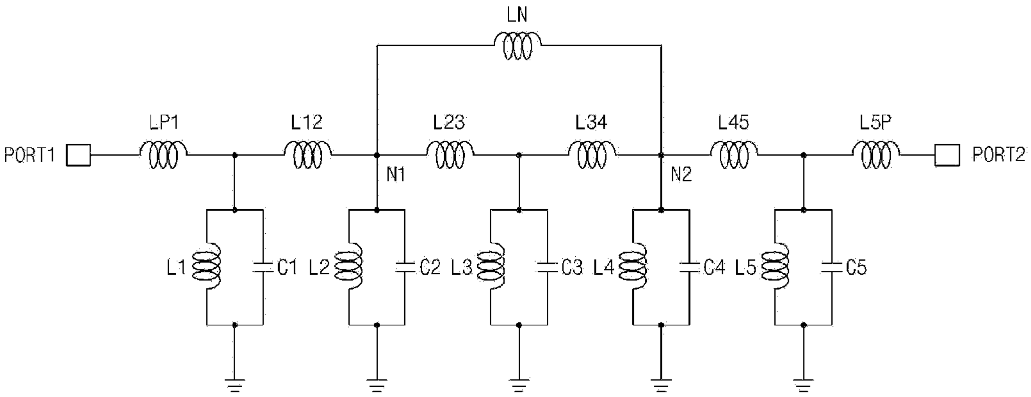
FIG. 9 is an equivalent circuit diagram of an embodiment of the resonance device shown in FIG. 4.

FIG. 9 is an equivalent circuit diagram of an embodiment of the resonance device shown in FIG. 4.

As shown in FIGS. 1, 3, 4 and 9, when compared to the equivalent circuit of the resonance device 100 of FIG. 3, the equivalent circuit of the resonance device 200 of FIG. 4 may further include a notch inductor LN.

When compared to the resonance device 100, the resonance device 200 further include the notch resonator 241, so the resonance device 200 further has a parallel inductance component, and this parallel inductance component may be expressed by the notch inductor LN that is connected to a first node N1 and to a second node N2 in parallel.

Figure 10:
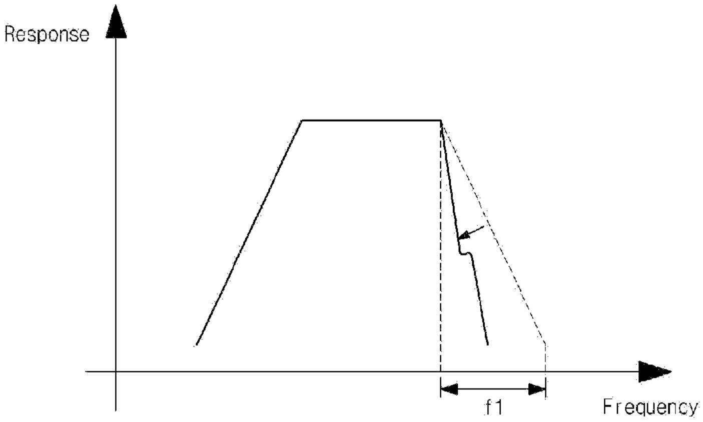
FIG. 10 is a graph showing the frequency response characteristics of the resonance device shown in FIG. 1 and the frequency response characteristics of the resonance device shown in FIG. 4 so as to compare the frequency response characteristics to each other.

FIG. 10 is a graph showing the frequency response characteristics of the resonance device shown in FIG. 1 and the frequency response characteristics of the resonance device shown in FIG. 4 so as to compare the frequency response characteristics to each other.

Referring to FIGS. 1 to 10, when it is assumed that the band pass characteristics of the resonance device 100 of FIG. 1 within a first frequency band f1 are shown by the dotted line, the band pass characteristics of the resonance device 200 of FIG. 4 may be expressed by the solid line.

When compared to the resonance device 100 of FIG. 1, the resonance device 200 of FIG. 4 further includes the notch resonator 241, so the resonance device 200 can confer notch filter effects on the first frequency band f1.

The notch filter effects may be controlled by controlling at least one of factors of the notch resonator 250, for example, the width and length of the transverse layers 246, 246A and 246B, the width and length of the short-ended layers 242, 242A, 242B, 244, 244A and 244B, and the width and length of the vias 243B and 246B of the notch resonator 250.

Figure 11:
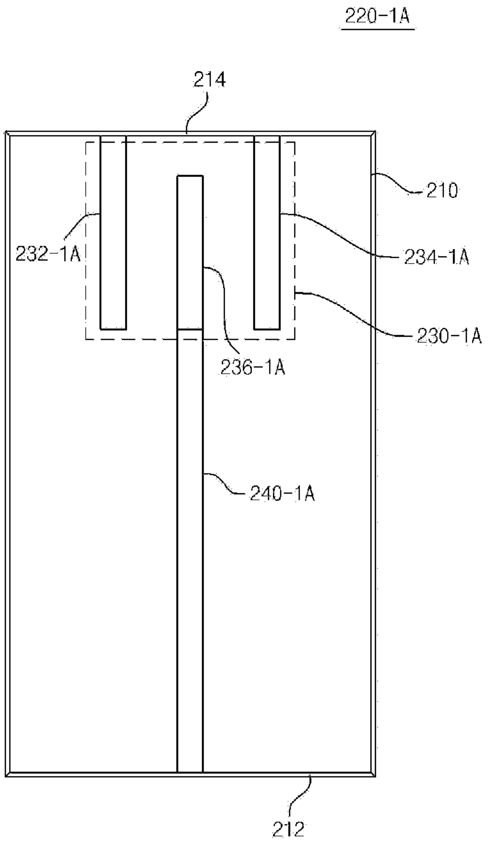
FIG. 11 is a side view of an embodiment of a resonator shown in FIG. 4.
Figure 12:
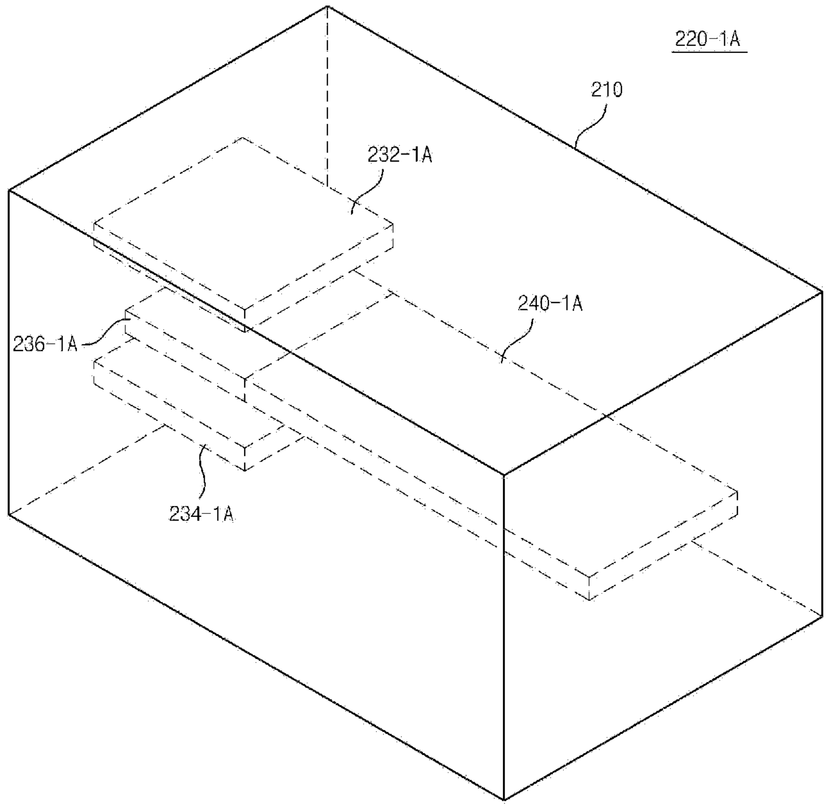
FIG. 12 is a perspective view of the resonator shown in FIG. 11.

FIG. 11 is a side view of an embodiment of a resonator shown in FIG. 4. FIG. 12 is a perspective view of the resonator shown in FIG. 11.

As shown in FIGS. 4, 11 and 12, the resonator 220-1A which is an embodiment of the resonator 220-1 of FIG. 4 may include a laminated part 230-1A and a transmitting layer 240-1A.

The laminated part 230-1A may include: a first conductive layer 232-1A grounded to the second ground surface 214, a second conductive layer 234-1A grounded to the second ground surface 214 and placed in a state of being spaced apart from the first conductive layer 232-1A, and a third conductive layer 236-1A placed between the first conductive layer 232-1A and the second conductive layer 234-1A without being grounded to the second ground surface 214.

The transmitting layer 240-1A may be connected to the third conductive layer 236-1A, and may be grounded to the first ground surface 212.

In an embodiment, each of the remaining resonators 220-2 to 220-5 may have the same structure as that of the resonator 220-1A.

Figure 13:
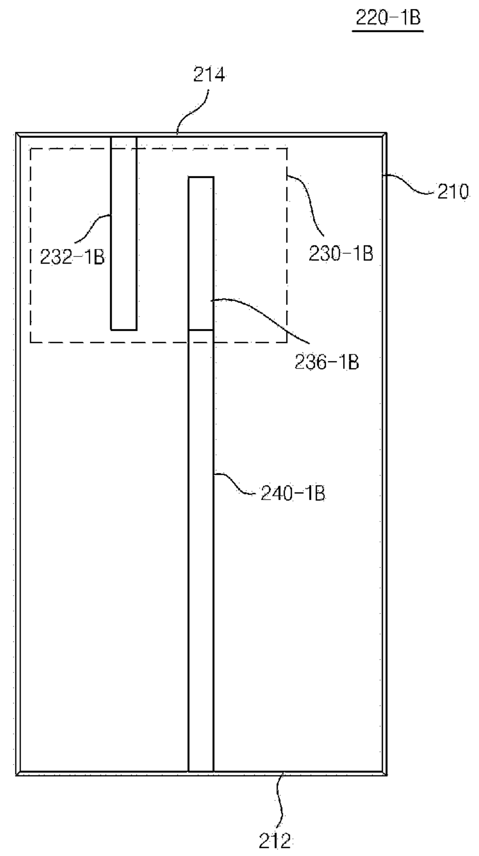
FIG. 13 is a side view of another embodiment of the resonator shown in FIG. 4.
Figure 14:
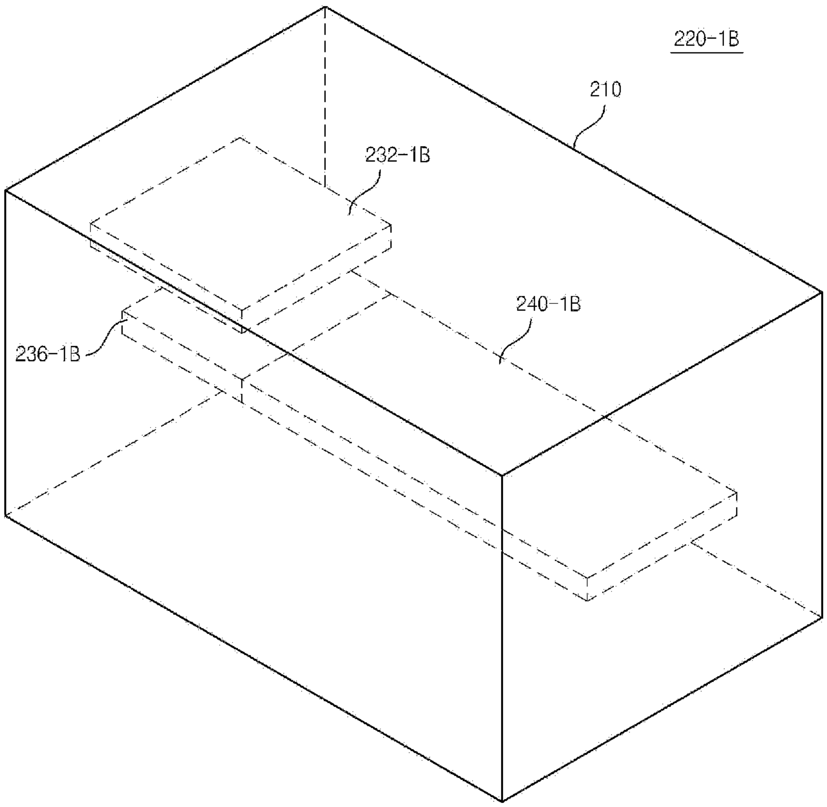
FIG. 14 is a perspective view of the resonator shown in FIG. 13.

FIG. 13 is a side view of another embodiment of the resonator shown in FIG. 4. FIG. 14 is a perspective view of the resonator shown in FIG. 13.

As shown in FIGS. 4, 13 and 14, the resonator 220-1B which is another embodiment of the resonator 220-1 of FIG. 4 may include a laminated part 230-1B and a transmitting layer 240-1B.

The laminated part 230-1B may include: a first conductive layer 232-1B grounded to the second ground surface 214, and a second conductive layer 236-1B placed in a state of being spaced apart from the first conductive layer 232-1B without being grounded to the second ground surface 214.

Here, the transmitting layer 240-1B may be connected to the second conductive layer 236-1B, and may be grounded to the first ground surface 212.

In an embodiment, each of the remaining resonators 220-2 to 220-5 may have the same structure as that of the resonator 220-1B.

Figure 15:
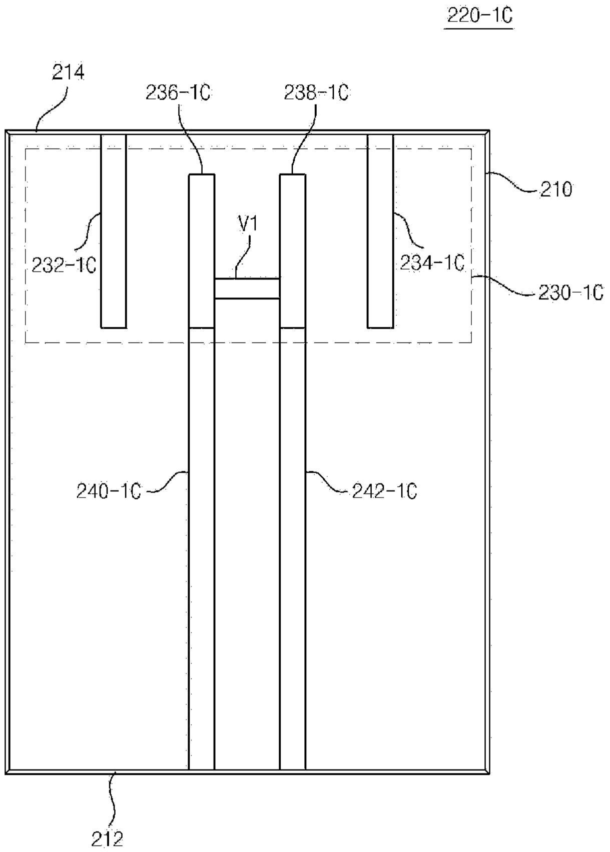
FIG. 15 is a side view of a further embodiment of the resonator shown in FIG. 4.
Figure 16:
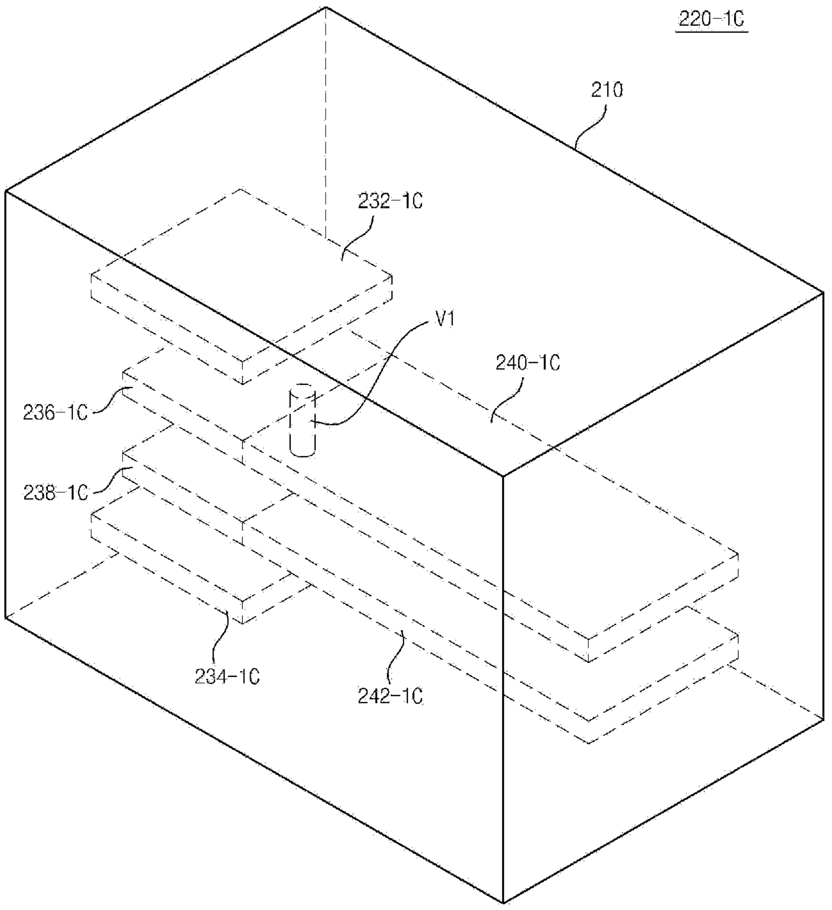
FIG. 16 is a perspective view of the resonator shown in FIG. 15.

FIG. 15 is a side view of a further embodiment of the resonator shown in FIG. 4. FIG. 16 is a perspective view of the resonator shown in FIG. 15.

As shown in FIGS. 4, 15 and 16, the resonator 220-1C which is a further embodiment of the resonator 220-1 of FIG. 4 may include a laminated part 230-1C and a plurality of transmitting layers 240-1C and 242-1C.

Here, the laminated part 230-1C may include a first conductive layer 232-1C, a second conductive layer 234-1C, a third conductive layer 236-1C, a fourth conductive layer 238-1C and a via V1.

Each of the first conductive layer 232-1C and the second conductive layer 234-1C may be grounded to the second ground surface 214. Further, the first conductive layer 232-1C and the second conductive layer 234-1C may be placed in a state of being spaced apart from each other.

The third conductive layer 236-1C and the fourth conductive layer 238-1C are not grounded to the second ground surface 214. The third conductive layer 236-1C and the fourth conductive layer 238-1C may be placed between the first conductive layer 232-1C and the second conductive layer 234-1C in a state of being spaced apart from the first conductive layer 232-1C and from the second conductive layer 234-1C, respectively.

The fourth conductive layer 238-1C may be placed between the third conductive layer 236-1C and the second conductive layer 234-1C.

The third conductive layer 236-1C and the fourth conductive layer 238-1C may be placed in a state of being spaced apart from each other.

The third conductive layer 236-1C may be electrically connected to the fourth conductive layer 238-1C by the via V1.

The first transmitting layer 240-1C may be connected to the third conductive layer 236-1C, and may be grounded to the first ground surface 212. The second transmitting layer 242-1C may be connected to the fourth conductive layer 238-1C, and may be grounded to the first ground surface 212.

In an embodiment, the resonator 220-1C may further include another via (not shown) in addition to the via V1.

In an embodiment, each of the remaining resonators 220-2 to 220-5 may have the same structure as that of the resonator 220-1C.

Figure 17:
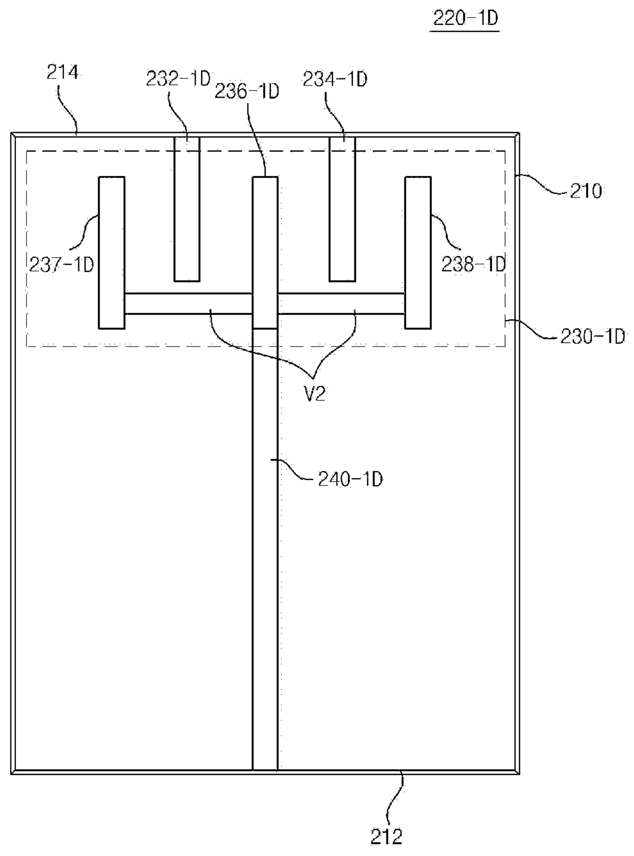
FIG. 17 is a side view of still another embodiment of the resonator shown in FIG. 4.
Figure 18:
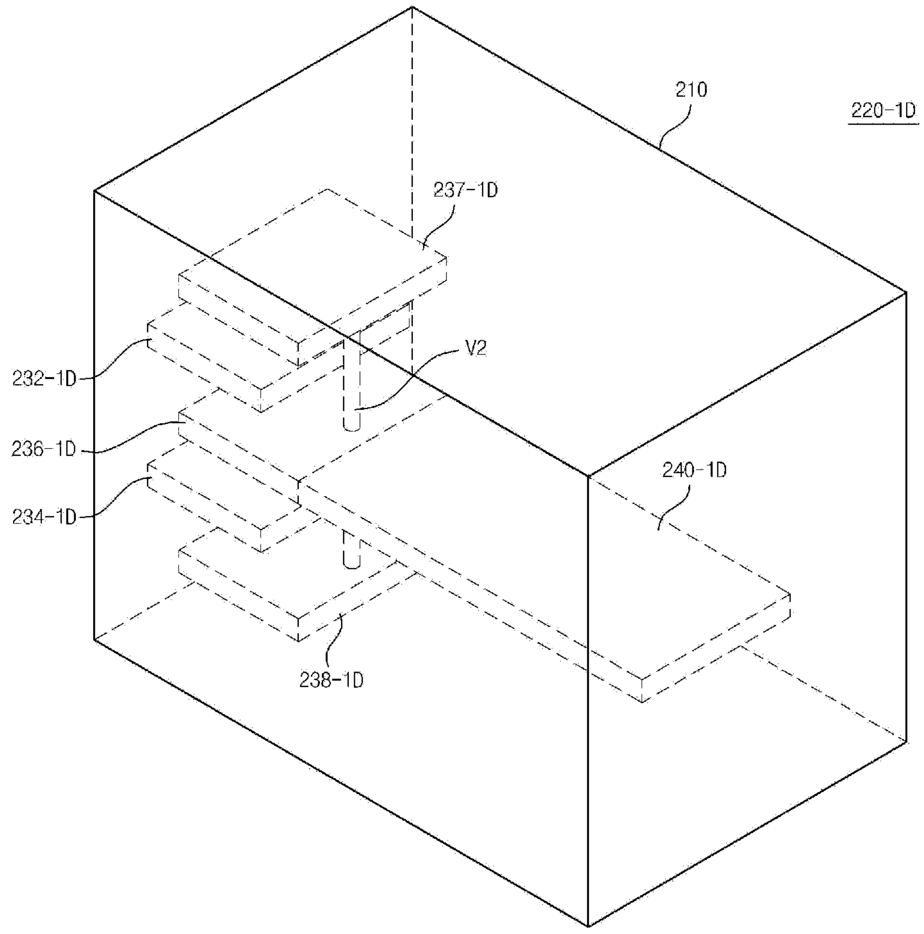
FIG. 18 is a perspective view of the resonator shown in FIG. 17.

FIG. 17 is a side view of still another embodiment of the resonator shown in FIG. 4. FIG. 18 is a perspective view of the resonator shown in FIG. 17.

As shown in FIGS. 4, 17 and 18, the resonator 220-1D which is still another embodiment of the resonator 220-1 of FIG. 4 may include a laminated part 230-1D and a transmitting layer 240-1D.

The laminated part 230-1D may include a first conductive layer 232-1D, a second conductive layer 234-1D, a third conductive layer 236-1D, a fourth conductive layer 237-1D, a fifth conductive layer 238-1D and a via V2.

Here, the first conductive layer 232-1D and the second conductive layer 234-1D may be grounded to the second ground surface 214, and may be placed in a state of being spaced apart from each other.

The third conductive layer 236-1D may be placed between the first conductive layer 232-1D and the second conductive layer 234-1D in a state of being spaced apart from the first conductive layer 232-1D and from the second conductive layer 234-1D, without being grounded to the second ground surface 214.

The fourth conductive layer 237-1D may be placed in a state of being spaced apart from the first conductive layer 232-1D and opposite to the third conductive layer 236-1D based on the first conductive layer 232-1D, without being grounded to the second ground surface 214.

The fifth conductive layer 238-1D may be placed in a state of being spaced apart from the second conductive layer 234-1D and opposite to the third conductive layer 236-1D based on the second conductive layer 234-1D, without being grounded to the second ground surface 214.

The via V2 may electrically connect the third conductive layer 236-1D, the fourth conductive layer 237-1D and the fifth conductive layer 238-1D to each other.

The transmitting layer 240-1D may be connected to the third conductive layer 236-1D, and may be grounded to the first ground surface 212.

In an embodiment, the resonator 220-1D may further include another via (not shown) in addition to the via V2.

In an embodiment, each of the remaining resonators 220-2 to 220-5 may have the same structure as that of the resonator 220-1D.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A resonance device comprising: a plurality of resonators arranged in a state of being spaced apart from each other; and
- a notch resonator formed over the plurality of resonators,
- wherein the notch resonator includes:
  - a transverse layer having an area overlapping with at least three resonators of the plurality of resonators; and
  - two or more short-ended layers connecting the transverse layer to a first ground surface.

2. The resonance device of claim 1, wherein the transverse layer and each of the two or more short-ended layers are connected to each other by a via.

3. The resonance device of claim 1, further comprising:
- a case provided with the first ground surface and a second ground surface facing the first ground surface, the case enveloping the plurality of resonators and the notch resonator therein.

4. The resonance device of claim 3, wherein each of the plurality of resonators comprises:
- a laminated part having a laminated structure formed by layering a plurality of conductive layers; and a first transmitting layer connected to one of the plurality of conductive layers, wherein the transverse layer has an area overlapping with first transmitting layer of each of the at least three resonators.

5. The resonance device of claim 4, wherein the plurality of conductive layers comprise:

a first conductive layer grounded to the second ground surface;

a second conductive layer grounded to the second ground surface and placed in a state of being spaced apart from the first conductive layer; and a third conductive layer placed between the first conductive layer and the second conductive layer in a state of being spaced apart from the first conductive layer and the second conductive layer, without being grounded to the second ground surface, wherein the first transmitting layer is connected to the third conductive layer.

6. The resonance device of claim 4, wherein the plurality of conductive layers comprise:

a first conductive layer connected to the second ground surface; and a second conductive layer placed in a state of being spaced apart from the first conductive layer, without being grounded to the second ground surface, wherein the first transmitting layer is connected to the second conductive layer.

7. The resonance device of claim 4, further comprising:

a second transmitting layer connected to another one of the plurality of conductive layers, wherein the plurality of conductive layers comprise:

a first conductive layer connected to the second ground surface;

a second conductive layer grounded to the second ground surface and placed in a state of being spaced apart from the first conductive layer;

a third conductive layer placed between the first conductive layer and the second conductive layer in a state of being spaced apart from the first conductive layer and the second conductive layer, without being grounded to the second ground surface; and a fourth conductive layer placed between the second conductive layer and the third conductive layer in a state of being spaced apart from the second conductive layer and the third conductive layer, without being grounded to the second ground surface, wherein the laminated part further includes a via electrically connecting the third conductive layer and the fourth conductive layer to each other.

8. The resonance device of claim 7, wherein the first transmitting layer is connected to the third conductive layer, and the second transmitting layer is connected to the fourth conductive layer.

9. The resonance device of claim 4, wherein the plurality of conductive layers comprise:

a first conductive layer connected to the second ground surface;

a second conductive layer grounded to the second ground surface and placed in a state of being spaced apart from the first conductive layer;

a third conductive layer placed between the first conductive layer and the second conductive layer in a state of being spaced apart from the first conductive layer and the second conductive layer, without being grounded to the second ground surface;

a fourth conductive layer placed in a state of being spaced apart from the first conductive layer and opposite to the third conductive layer based on the first conductive layer, without being grounded to the second ground surface; and a fifth conductive layer placed in a state of being spaced apart from the second conductive layer and opposite to the third conductive layer based on the second conductive layer, without being grounded to the second ground surface, wherein the laminated part further includes a via electrically connecting the third conductive layer, the fourth conductive layer and the fifth conductive layer to each other.

10. A band pass filter including the resonance device of claim 1.

* * * * *